United States Patent [19]

Hayashi

[11] 4,167,780
[45] Sep. 11, 1979

[54] DATA PROCESSING UNIT HAVING SCAN-IN AND SCAN-OUT MEANS

[75] Inventor: Hiromu Hayashi, Sagamihara, Japan
[73] Assignee: Fujitsu Limited, Kawasaki, Japan
[21] Appl. No.: 844,392
[22] Filed: Oct. 21, 1977
[30] Foreign Application Priority Data
Oct. 22, 1976 [JP] Japan .................. 51/127098
[51] Int. Cl.² .................. G06F 3/00; G06F 11/06
[52] U.S. Cl. .................. 364/200; 235/302
[58] Field of Search ... 364/900 MS File, 200 MS File, 364/580; 235/302

[56] References Cited
U.S. PATENT DOCUMENTS

| | | | |
|---|---|---|---|
| 3,061,192 | 10/1962 | Terzian | 364/200 |
| 3,462,742 | 8/1969 | Miiller | 364/200 |
| 3,702,988 | 11/1972 | Haney | 364/200 |
| 3,740,722 | 6/1973 | Greenberg | 364/200 |
| 3,793,631 | 2/1974 | Silverstein | 364/200 |
| 3,833,888 | 9/1974 | Stafford | 364/200 |
| 3,938,098 | 2/1976 | Garlic | 364/200 |
| 3,984,813 | 10/1976 | Chung | 364/200 |
| 4,086,658 | 4/1978 | Finlay | 364/900 |

OTHER PUBLICATIONS

"Intel MCS-4 Micro Computer Set," Intel Corp., Jan. 1972.

Primary Examiner—James D. Thomas
Attorney, Agent, or Firm—Staas & Halsey

[57] ABSTRACT

Disclosed herein is a data processing unit including a scan-in register, a scan-out register and conventional facility and control circuit divisions. The scan-in register supplies at any desired time external predetermined control data to the facility circuit division independently from control data produced by the control circuit division. The scan-out register transmits at any desired time the control data produced by the control circuit division. Then the control data is extracted from the data processing unit. Both the scan-in register and the scan-out register are used for carrying out a diagnostic check of the facility and control circuit divisions.

16 Claims, 8 Drawing Figures

DATA PROCESSING UNIT HAVING SCAN-IN AND SCAN-OUT MEANS

BACKGROUND OF THE INVENTION

1. Field of the Invention

The present invention relates to a data processing unit, and more particularly relates to means for carrying out a diagnostic check of the data processing unit.

2. Description of the Prior Art

A data processing unit can comprise an LSI (Large Scale Integration) element. The LSI element offers a complete circuit on a very small chip which can contain ten thousand logic circuits or more. It is very difficult for operator to perform a diagnostic check of the LSI data processing unit since it is very difficult to directly test each of the logic circuits contained in the LSI chip by means of a very small testing probe. Furthermore, there are an enormous number of logic circuits contained in the LSI chip, and the chip may be as small as 0.1 square inch in area. Therefore, the diagnostic check is usually carried out by testing the electric signal appearing at each of the external pins extending from the LSI chip. The number of external pins, which is usually about a hundred, is very small when compared to the number of logic circuits contained in a single LSI chip. Accordingly, the operator can easily carry out a diagnostic check of the LSI data processing unit by using a testing probe which is sequentially connected to the respective external pins extending from the LSI chip and thus can detect whether or not the data processing unit is operating correctly. However, if the data processing unit is found to be operating incorrectly during the diagnostic test, it would then be impossible to then utilize this method to further discover and investigate the location of the faults within the chip or the reasons for the errors or troubles occurring within the data processing unit. This is because, as previously mentioned, such a diagnostic check in accordance with the prior art cannot be carried out by directly probing each of the numerous logic circuits contained in the LSI chip. Instead, the diagnostic check is carried out by indirectly probing each of the external pins of the LSI chip.

SUMMARY OF THE INVENTION

The object of the present invention is to provide means for carrying out a diagnostic check for a data processing unit comprising an LSI chip. Such a diagnostic check can be used to discover the location of faults and to investigate the reasons for errors occurring when the data processing unit is not operating correctly.

BRIEF DESCRIPTION OF THE DRAWINGS

The present invention will be more apparent from the ensuing description with reference to the accompanying drawings wherein.

DESCRIPTION OF THE PREFERRED EMBODIMENTS

A conventional data processing unit is usually comprised of various kinds of function units, such as an ALU unit (Arithmetic and logic unit), an address increment circuits, a control storage addressing register, a decoder, a local storage, registers, a shifter and so on. However, it should be noted that the above-mentioned function units are classified into two different circuit divisions. The first circuit division is a control circuit division for decoding a machine instruction or microinstruction which instructs a data processing unit to perform certain prescribed operations. The second circuit division is a facility circuit division which generally performs arithmetic operations on given operand data in accordance with control data provided from the control circuit division. If the diagnostic check of the control circuit division and the diagnostic check of the facility circuit division can be performed independently from each other when carrying out the diagnostic check of the data processing unit, then the accuracy of the diagnostic check will be increased, and accordingly, a relatively detailed investigation can be performed to enable the locating and discovering of the reasons for the occurrence of errors or troubles in the data processing unit. This is in contradistinction to the prior art methods wherein the diagnostic check is carried out by testing the electric signal which appears at each of the external pins and wherein such signals only indicate the general results which have been processed simultaneously by both the control circuit division and the facility circuit division.

In the present invention, a scan-in register and a scan-out register are further added to the conventional data processing unit. The facility circuit division can be operated independently from the control circuit division by applying control data to the control circuit division by an external control data supply, for example, a service processor, by means of the scan-in register. On the other hand, control data provided from the control circuit division can be independently produced by the data processing unit by means of the scan-out register.

Figure 1:
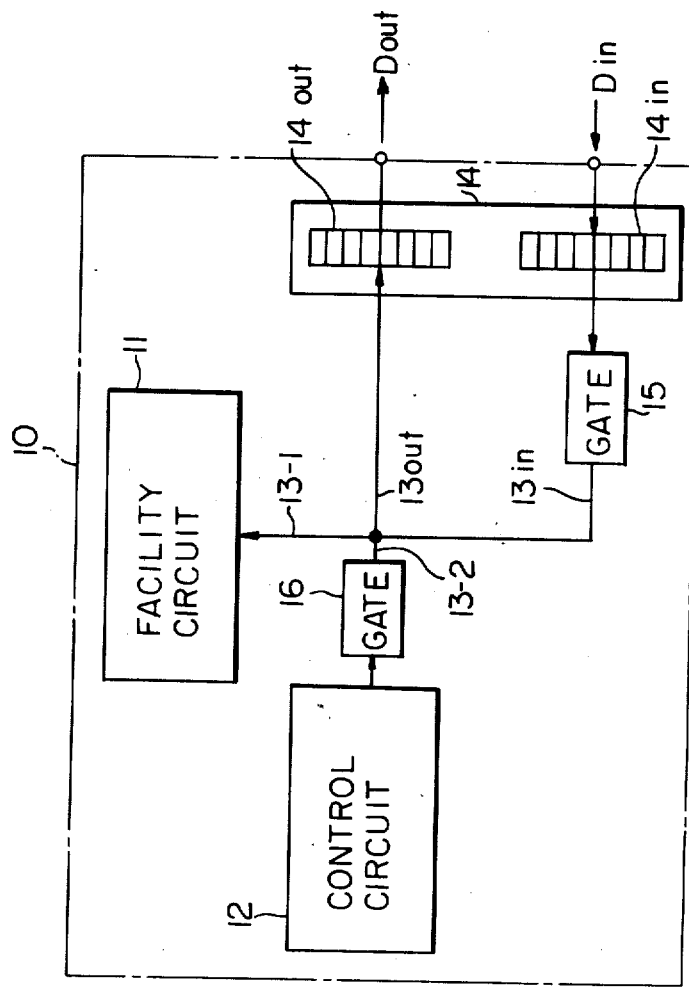
FIG. 1 illustrates a data processing unit adapted for implementation of the present invention.

FIG. 1 illustrates a data processing unit adapted for implementing the present invention. In FIG. 1, the reference numeral 10 represents an LSI data processing unit. The facility circuit division is schematically shown as a block referenced by the numeral 11, and the control circuit division is schematically shown as a block referenced by the numeral 12. The facility circuit division 11 and the control circuit division 12 are interconnected by control buses 13-1 and 13-2. The reference numeral 14 indicates a scan register comprised of both a scan-in register $14_{in}$ and a scan-out register $14_{out}$ according to the present invention. The reference numerals $13_{in}$, $13_{out}$, 15 and 16 represent a scan-in control bus, a scan-out control bus, a scan-in gate circuit and a scan-out gate circuit, respectively according to the present invention. When a diagnostic check of the data processing unit 10 is required, the predetermined external control data $D_{in}$ is stored in the scan-in register $14_{in}$ and suitably arranged therein. Then, the gate circuit 16 is closed to inhibit data flow and the gate circuit 15 is opened to enable data flow. Consequently, the external control data $D_{in}$ is transferred from the scan-in register $14_{in}$ to the facility circuit division 11 over the control buses $13_{in}$ and 13-1 and through the gate circuit 15. Therefore, the facility circuit division 11 can perform arithmetic operations on given operand data not in accordance with control data provided from the control circuit division 12, but in accordance with predetermined external control data $D_{in}$. When predetermined external control data $D_{in}$ is supplied to the facility circuit division 11, and when the result produced therefrom coincides with the expected result, (the expected result being the result obtained when known predetermined external control data $D_{in}$ is supplied to the facility circuit division 11), then the detected error or trouble must be occurring not in the facility circuit division 11, but in the control circuit division 12. If the result produced by the facility circuit division 11 does not coincide with the expected result, then the detected error or trouble must be occurring in the facility circuit division 11. In the latter case, the scan-in gate circuit 15 will be closed to inhibit data flow and the gate circuit 16 will be opened to enable data flow. Then the control data provided from the control circuit division 12 is sampled and transferred over the control buses 13-2 and $13_{out}$, through the gate circuit 16, and to the scan-out register $14_{out}$ to be stored therein. The sampled control data $D_{out}$ from the register $14_{out}$ is checked by an appropriate check means (not shown). Accordingly, this check means verifies the fact of whether or not the control circuit division 12 is producing correct control data.

Figure 2:
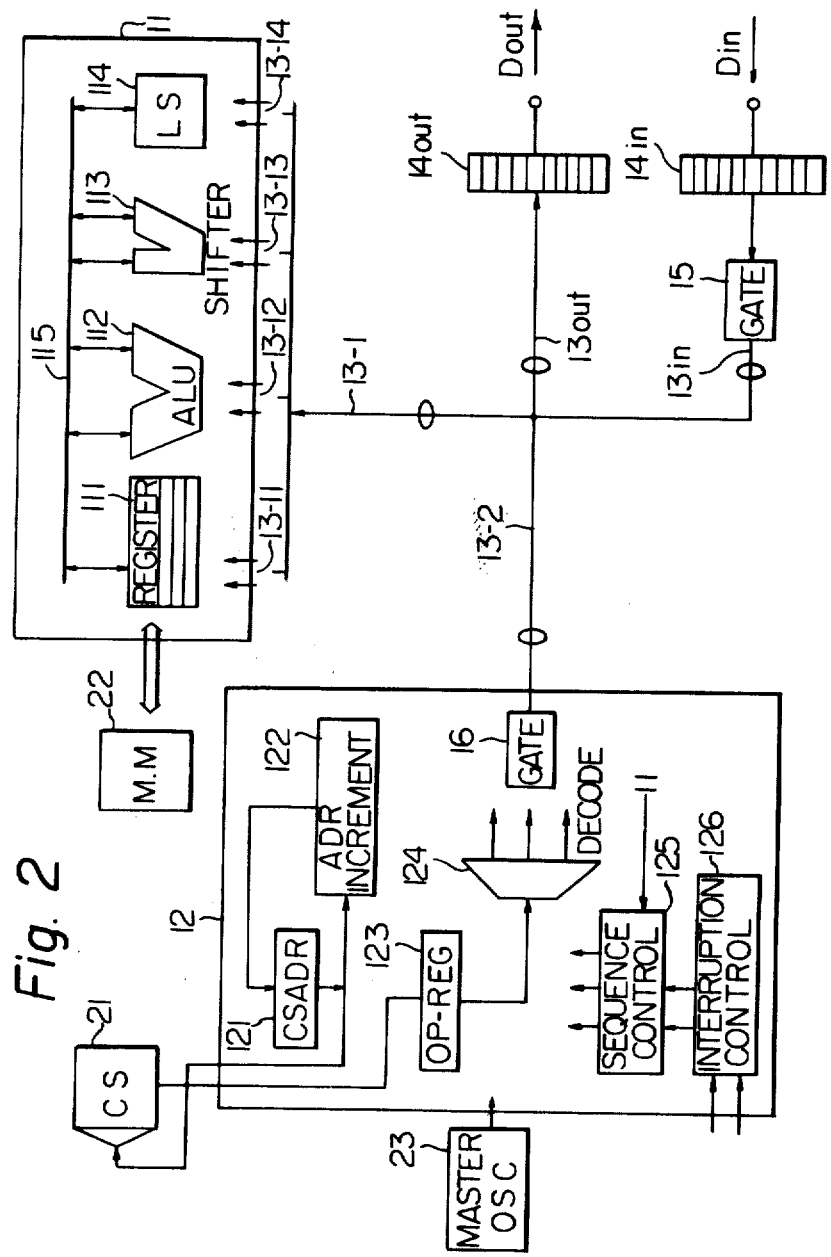
FIG. 2 illustrates a detailed embodiment of the data processing unit shown in FIG. 1.

FIG. 2 illustrates a detailed embodiment of the data processing unit shown in FIG. 1. In FIG. 2, the facility circuit division 11 is comprised of registers 111, an ALU 112, a shifter 113 and a local storage unit 114. The control circuit division 12 is comprised of a control storage address register 121, an address increment circuit 122, an operation register 123, a decoder 124, a sequence control unit 125 and an interruption control unit 126. The reference numerals 21, 22 and 23, designate a control storage, a main memory and a master oscillator respectively. These members 21, 22 and 23 are located outside of the LSI data processing unit 10 (see FIG. 1). When the control storage address register 121 specifies an address in the control storage 21, a microprogram stored at the specified address is then set in the operation register 123. When one microprogram is fetched from the control storage 21, the address increment circuit 122 effects an address increment by one address. As a result, another microprogram is then fetched from the control storage 21. The sequence of the read-out operations of the microprograms is controlled by the sequence control unit 125, which unit 125 receives sequence control information supplied from the facility circuit division 11 and also from the interruption control unit 126. The interruption control unit 126 receives interruption information supplied from a source located outside of the LSI data processing unit 10 (FIG. 1).

The microprogram stored in the operation register 123 is sequentially decoded into control data by means of a decoder 124 and then supplied to the registers 111, the ALU 112, the shifter 113 and the local storage unit 114 by way of the control buses 13-2 and 13-1. Consequently, the scan-out gate circuit 16 according to the present invention is opened to enable data flow. In the facility circuit division 11, the registers 111 are controlled by control data transmitted from a control bus 13-11 to store data from the main memory 22 or to send data thereto under control of the control data. The registers 111, the ALU 112, the shifter 113 and the local storage unit 114 are interconnected by means of a data bus 115, wherein the ALU 112 functions to perform an arithmetic operation with respect to the given operand data, the local storage unit 114 functions to temporarily store data, and the shifter functions to shift all bits of data to the right or to the left with respect to the bit stream of data. The master oscillator 23 provides a main clock pulse signal to those function units which require main clock pulses.

In FIG. 2, when a diagnostic check of the facility control division 11 is required, for example, when the ALU 112 is required to be tested, external predetermined control data $D_{in}$ for controlling the ALU 112 is first stored in the scan-in register $14_{in}$ comprising a shift register. In this case, the scan-out gate circuit 16 is closed by a control signal supplied from an appropriate means (not shown) and therefore inhibits the control data of the decoder 124 from being supplied to the facility circuit division 11. At the same time, the scan-in gate circuit 15 is opened by the above-mentioned appropriate means (not shown), and the control data $D_{in}$ stored in the scan-in register $14_{in}$ is supplied to the ALU 112 by way of the control buses $13_{in}$ and 13-1. Then, the ALU 112 starts to operate under control of the control data $D_{in}$. If the result of the ALU 112 does not coincide with the expected result, the error or trouble is determined to be occurring in the ALU 112. Similarly, if the result of the registers 111, the shifter 113 or the local storage unit 114 does not coincide with the respective expected result, the error or trouble is determined to be occurring in the member 111, 113 or 114. However, if the above members 111 through 114 are determined to be operating in a normal condition with no errors or troubles occurring therein, then the control data from the decoder 124 should be checked for correctness. In this case, the scan-in gate circuit 15 is closed and the scan-out gate circuit 16 is opened. Then the control data from the decoder 124 is stored in the scan-out register $14_{out}$ comprising a shift register and then provided as scan-out data $D_{out}$ to a check means (not shown).

Figure 3:
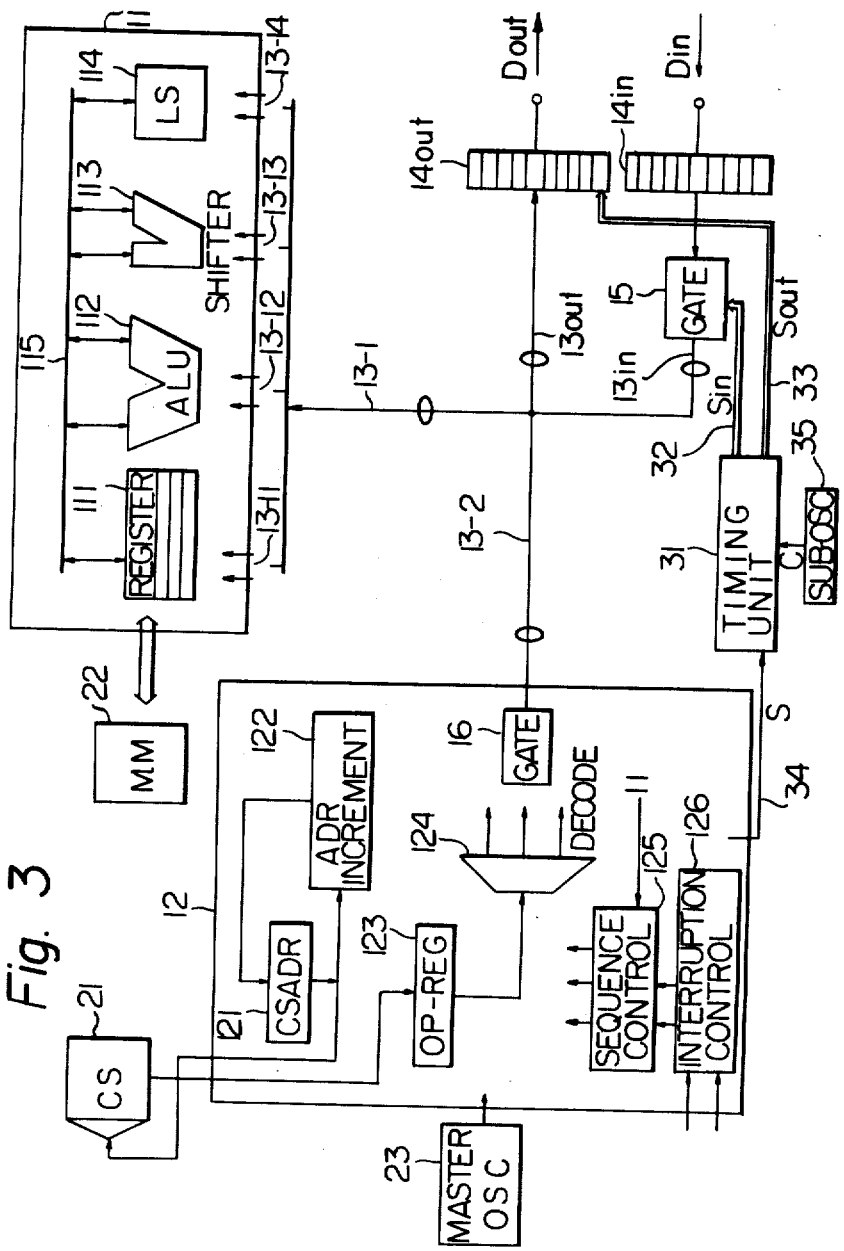
FIG. 3 illustrates a data processing unit comprising means for carrying out a general purpose diagnostic check according to the present invention.

The fundamental operation of the means for carrying out the diagnostic check of the data processing unit, according to the present invention, is mentioned hereinbefore. Furthermore, this means can also be utilized for carrying out a general purpose diagnostic check of the data processing unit. The general purpose diagnostic check will be explained hereinafter. As is already known, the data processing unit usually completes one operation for one microprogram within a predetermined fixed period which corresponds exactly to the duration of the period of main clock pulse signal produced by the master oscillator 23 (FIG. 2). Accordingly, as shown in FIG. 2, the control data transferred over the control buses 13-11 through 13-14 must be provided from the decoder 124 at predetermined respective times occurring within the duration of the main clock pulse signal produced by the master oscillator 23. For example, if the control data for controlling the ALU 112 is sent from the decoder 124 to the control bus 13-2 at a time which does not coincide exactly with a predetermined time, a malfunction will occur in the ALU 112. Similarly, if the control data for controlling the registers 111, the shifter 113 or the local storage unit 114 is sent from the decoder 124 to the control bus 13-11, 13-13 or 13-14 at a time which does not coincide exactly with a respective predetermined time, a malfunction will occur in the registers 111, the shifter 113 or the local storage unit 114. Accordingly, it is important to check whether or not each control data signal transmitted from the decoder 124 is produced at its predetermined respective time. On the other hand, it is also important to detect an allowed time variation of the predetermined respective time, during which allowed time variation each of the members 111 through 114 can still perform normal operations, (that is to say a malfunction will not occur therein). FIG. 3 illustrates a data processing unit containing means for carrying out the above-mentioned general purpose diagnostic check, according to the present invention. As seen in FIG. 3, this data processing unit further contains a timing unit 31, a control line 32, a control line 33, a clock line 34 and a sub-oscillator 35, in addition to the parts of the data processing unit shown in FIG. 2. In FIG. 3, the timing unit 31 operates synchronously with a start signal S applied through the clock line 34, which start signal S is synchronous with the main clock pulse signal produced by the master oscillator 23. Accordingly, the timing unit 31 also receives a sub-clock pulse signal C produced by the sub-oscillator 35. The period of the sub-clock pulse signal C is far shorter than the period of the main clock pulse signal, for example, the period of the former signal is one eighth of the period of the latter signal. In addition, the sub-clock pulse signal C is synchronous with the main clock pulse signal S. A scan-in control signal $S_{in}$, transferred over the control line 32, is used to determine the starting time and the stopping time of the operation of the scan-in register $14_{in}$. A scan-out control signal $S_{out}$, transferred over the control line 33, is used to determine the starting time and the stopping time of the operation of the scan-out register $14_{out}$. The stopping times of the scan-in register $14_{in}$ and scan-out register $14_{out}$ are simultaneous to each completion of the period of the main clock pulse signal.

In contradistinction, the starting times of the scan-in register $14_{in}$ and the scan-out register $14_{out}$ can be optionally selected according to the desired purpose of the diagnostic check.

Figure 4:
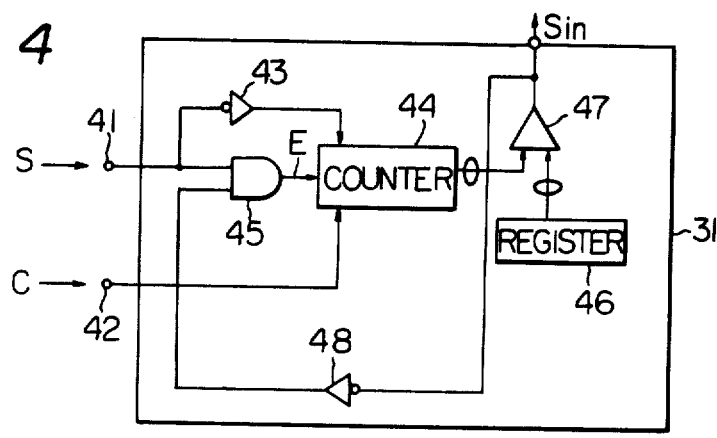
FIG. 4 illustrates a detailed example of a timing control unit used for a scan-in operation comprising a timing unit 31 as shown in FIG. 3.
Figure 5:
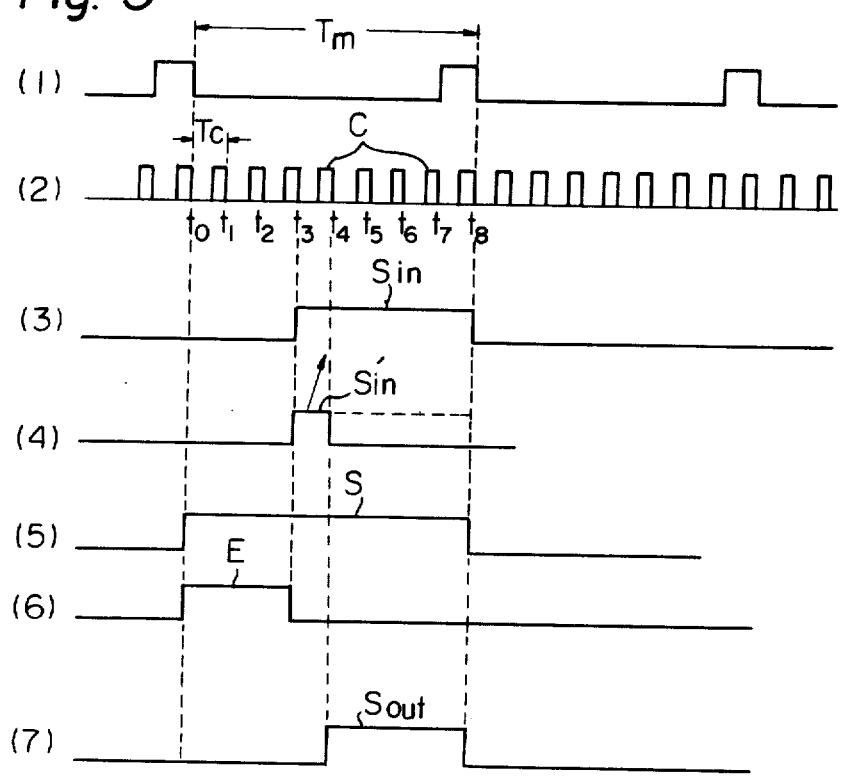
FIG. 5 depicts a timing chart which explains the operations of the timing unit 31.

FIG. 4 illustrates the timing unit 31 shown in FIG. 3, especially the timing control unit for the scan-in operation. The operation of the timing unit 31 will be explained hereinafter by referring to FIGS. 4 and 5. FIG. 5 is a timing chart which illustrates the pulse signals produced by the timing unit 31, the master oscillator 23 and the sub-oscillator 35. The start signal S (see waveform (5) in FIG. 5) is applied to a terminal 41. It should be noted that the pulse width of the start signal S is the same as the period $T_m$ of the main clock pulse signal (see waveform (1) in FIG. 5). The start signal S is applied through an inverter 43 to a reset terminal of a counter 44 for clearing the counter 44. At the same time an enabling signal E is applied through an AND gate 45 to a set terminal of the counter (see waveform (6) in FIG. 5). Then the counter 44 starts counting the sub-clock pulse signal C applied to a terminal 42. The period $T_c$ of the sub-clock pulse signal C is far shorter than the period $T_m$ of the main clock pulse signal (see waveform (2) in FIG. 5).

If the operator wishes to supply the external predetermined control data $D_{in}$, stored in the scan-in register $14_{in}$ (FIG. 3), to a desired member, for example, to the ALU 112 (FIG. 3) at a predetermined time $t_3$ (see column (2) in FIG. 5), according to the selected purpose of the diagnostic check, a count number "three" is preset in a register 46 (FIG. 4). In FIG. 4, when the counter 44 has counted three clock pulses of the sub-clock pulse signal C, a comparator 47 is used to determine that the preset count number "three" of the register 46 coincides with the count number of the counter 44. Then, the comparator 47 produces and sends the scan-in control signal $S_{in}$ to the control line 32 (FIG. 3). Thereby, the scan-in gate circuit 15 (FIG. 3) is opened and the external predetermined control data $D_{in}$ is supplied from the scan-in register $14_{in}$ (FIG. 4) to a selected member, for example, to the ALU 112 (FIG. 3). Consequently, the ALU 112 starts to operate at the time $t_3$ under the control of the external predetermined control data $D_{in}$. The scan-in control signal $S_{in}$ is shown in waveform (3) of FIG. 5. In FIG. 4, the signal $S_{in}$ is fed back to the AND gate 45 through an inverter 48. If the signal $S_{in}$ cannot be fed back to the AND gate 45, then the signal $S_{in}$ is provided only during one short period $T_c$ of the sub-clock pulse signal C as shown by the signal $S_{in}$ in waveform (4) of FIG. 5. In FIG. 4, the signal applied from the comparator 47 through the inverter 48 closes the AND gate 45 and prevents the counter 44 from further counting the sub-clock pulse signal C. Accordingly, the counter 47 continues to provide the scan-in control signal $S_{in}$ until the start signal S disappears. If the operator wishes to supply the external predetermined control data $D_{in}$ stored in the scan-in register $14_{in}$ (FIG. 4) to a desired member, for example, to the registers 111 (FIG. 4) at a predetermined time $t_6$ (see waveform (2) in FIG. 5) according to the purpose of the diagnostic check, the count number "six" should be preset in the register 46 (FIG. 4). Thus, the external predetermined control data $D_{in}$ used for carrying out the diagnostic check can be freely provided at any time to any desired member in the facility circuit division 11 (FIG. 3).

When it is necessary to check whether or not the control data from the decoder 124 (FIG. 3) is produced at a predetermined time, the other timing control unit for the scan-out operation, comprising the timing unit 31, is operated. The timing control unit for the scan-out operation has the same circuit construction as that shown in FIG. 4. If the operator wishes to check whether or not the control data for one of the members, for example, the shifter 113 (FIG. 3) is produced at the desired time $t_4$ (see waveform (2) in FIG. 5), the number "four" should be preset in a register (not shown) similar to the register 46 in FIG. 4. When a counter (not shown) similar to the counter 44 in FIG. 4 has counted four clock pulses of the sub-clock pulse signal C (FIG. 3), a comparator (not shown) similar to the comparator 47 in FIG. 4 provides the scan-out control signal Sout to the control line 33 (FIG. 3). Thereby, the scan-out register $14_{out}$ (FIG. 3) starts storing the control data provided from the decoder 124 (FIG. 3) at the time $t_4$. In this example, if the control data for the shifter 113 cannot be stored correctly in the scan-out register $14_{out}$, the operator will be able to determine that the error or trouble involving the control data for the shifter is occuring in the control circuit division 12 (FIG. 3). The above-mentioned timing unit 31 may be mounted inside a single-chip LSI data processing unit, or may be optionally located outside the single-chip LSI data processing unit.

Figure 6:
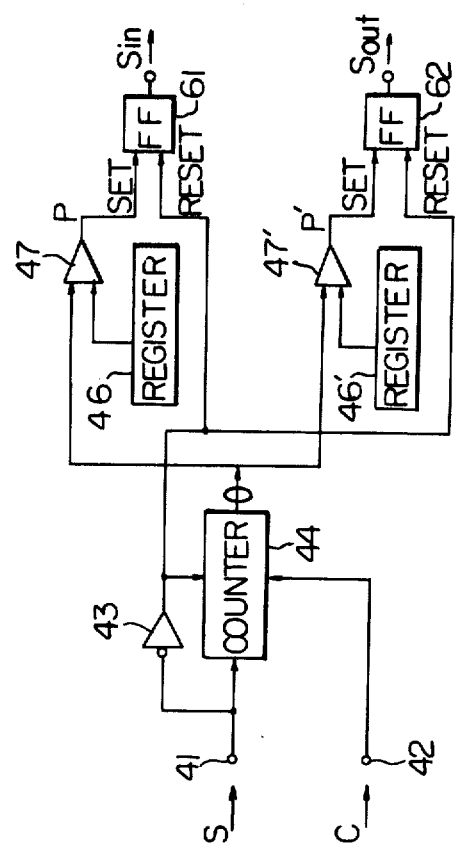
FIG. 6 illustrates another example of the timing control unit comprising the timing unit 31.

FIG. 6 illustrates another example of the timing unit 31 shown in FIG. 3. In FIG. 6, the reference numerals 41, 42, 43, 44, 46 and 47 represent the same members as those with the same numbers shown in FIG. 4. A flip-flop 61 produces the scan-in control signal $S_{in}$, and a flip-flop 62 produces the scan-out control signal $S_{out}$. The reference numerals 46' and 47' respectively represent a register and a comparator, both for effecting scan-out operation. If, for example, the operator wishes to provide the scan-in control signal $S_{in}$ at the time $t_2$ (see waveform (2) in FIG. 5) and at the same time to provide the scan-out control signal $S_{out}$ at the time $t_7$ (see waveform (2) in FIG. 5), he will preset the number "two" in the register 46 and also preset the number "seven" in the register 46'. While the start signal S (see waveform (2) and (5) in FIG. 5) is OFF, the counter 44, the flip-flops 61 and 62 are reset to respective initial states. When the start signal S is turned ON, the counter 44 starts counting the number of clock pusles of the sub-clock pulse signal C. When the counter 44 has counted two clock pulses, the comparator 47 produces a coincident signal P, and the flip-flop 61 continues to produce the signal $S_{in}$ until the flip-flop 61 is reset again to its initial state at the end of the start signal S. When the counter 44 has counted seven clock pulses, the comparator 47' produces a coincident signal P' and the flip-flop 62 continues to produce the signal $S_{out}$ until the flip-flop 62 is reset again to its initial state, at the end of the start signal S.

Figure 7:
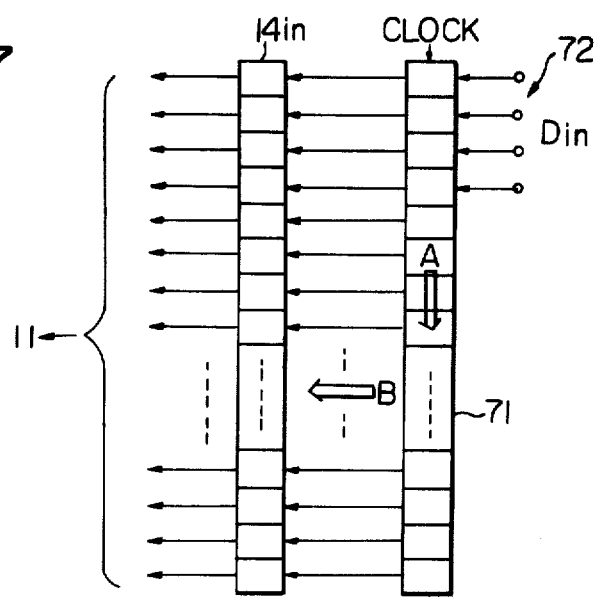
FIG. 7 illustrates a modification of the scan-in register $14_{in}$ according to the present invention as shown in FIG. 3.

In FIG. 3, as previously mentioned, the data processing unit further includes both the scan-in register $14_{in}$ comprising a shift register and the scan-out register $14_{out}$ comprising a shift register. Accordingly, the LSI data processing unit should have many external output pins which correspond to the large number of output bits of the shift register ($14_{out}$). Also, the LSI data processing unit should have many external input pins which correspond to the large number of input bits of the shift register ($14_{in}$). However, it is not desirable to increase the number of external pins extending from the LSI data processing unit. In this respect, the shift register ($14_{in}$) should therefore be accompanied by a scan-in interface 71 shown in FIG. 7. Also, the shift register ($14_{out}$) should be accompanied by a scan-out interface 81 shown in FIG. 8. In FIG. 7, the scan-in interface 71, comprising a shift register, receives the first group of four bits of the control data $D_{in}$. The control data $D_{in}$ being comprised of, for example, forty-eight bits. Accordingly, the shift register (71) shifts the first group of four bits downwardly along the arrow A shown in FIG. 7. Thereafter, the shift register (71) receives the second group of four bits of the control data $D_{in}$. Subsequently, the shift register (71) shifts the second group of four bits downwardly along the arrow A together with the first group of four bits. The above-described operations are repeated again. When the shift register (71) has received the twelfth group of four bits, the forty-eight bits of control data $D_{in}$ are simultaneously transferred to the scan-in register $14_{in}$ along the arrow B shown in FIG. 7. The control data $D_{in}$ is then supplied to a selected member in the facility circuit division 11 (FIG. 3). As is apparent from FIG. 7, although the scan-in register $14_{in}$ would normally require forty-eight external output pins of the LSI data processing unit, according to the present invention it is sufficient to allow only four external output pins 72 due to the presence of the scan-in interface 71.

Figure 8:
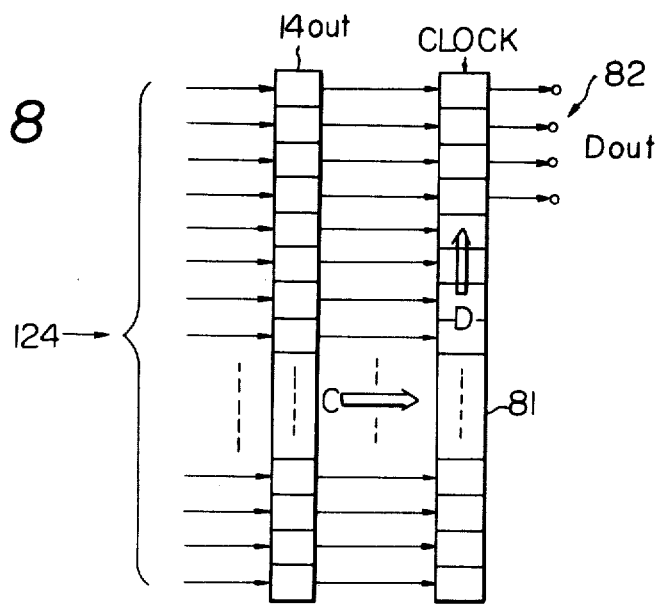
FIG. 8 illustrates a modification of the scan-out register $14_{out}$ shown in FIG. 3.

In FIG. 8, the scan-out control data from the decoder 124 (FIG. 3) is momentarily stored in the scan-out register $14_{out}$. Thereafter, all bits of the control data $D_{out}$ are transferred to the scan-out interface 81 along the arrow C. Then, the first group of four bits of the control data $D_{out}$ is sent out from the shift register (81). Thereafter, the remaining forty-four bits are shifted upwardly along the arrow D in FIG. 8 and the second is group of four bits sent out therefrom. Accordingly, these operations are repeated until all bits of the scan-out data $D_{out}$ are sent out from the LSI data processing unit 10 (FIG. 1). As is apparent from FIG. 8, the forty bits of the scan-out control data $D_{out}$ are sequentially sent out from only four external output pins 82 of the LSI data processing unit 10 (FIG. 1).

As mentioned above, according to the present invention, a diagnostic check can be easily carried out to determine whether or not various kinds of control data from the control circuit division are correctly produced at the respective desired times within each period of the main clock pulse signal. Furthermore, it is easy to supply the desired control data to the facility circuit divisions at a desired time within each period of the main clock pulse signal. According to the above steps it would be easy to determine the location of and the reason for any errors or troubles occurring in the LSI data processing unit. In addition, it is also possible to investigate the kinds of results produced from the facility circuit division in accordance with variations of time, which variations deviating from the predetermined correct time at which the control data has to be produced from the control circuit division.

What is claimed is:

1. A data processing unit comprising:
    a means for providing given instructions;
    a facility circuit division means for performing arithmetic and logical operations for given operand data in accordance with prescribed control data;
    a control circuit division means, operatively connected to said facility circuit division means and said means for providing given instructions, for decoding said given instructions and providing said control data to said facility circuit division means in accordance with said decoded given instructions;
    a first control bus means and a second control bus means operatively connected between said facility circuit division means and said control circuit division means for providing a data path therebetween;
    input and output means, operatively connected to said first and second control bus means respectively by output and input control bus means, for enabling the transfer of data to and from said data processing unit;
    a scan-in register means, operatively connected between said input means and said facility circuit division means by said input control bus means and said first control bus means, for storing external predetermined control data and for supplying said external predetermined control data to said facility circuit division means;
    a scan-in gate circuit means, operatively connected between said scan-in register means and said input control bus means, for controlling the flow of data from said scan-in register means to said input control bus means;

a scan-out gate circuit means, operatively connected between said control circuit division means and said second control bus means, for controlling the flow of data from said control circuit division means to said second control bus means;

wherein said scan-in and scan-out gate circuit means are operated selectively to alternatively allow said external predetermined control data stored in said scan-in register or said control data produced by said control circuit division means to be transfered to said facility circuit division means to be transfered to said facility circuit division means; and wherein said scan-in register is connected to a scan-in interface comprised of a shift register, and wherein said shift register receives and stores each group of bits of said external predetermined control data and also shifts said group of bits in said shift register reciprocally and sequentially, and when all the bits of said external predetermined control data are stored in said shift register, all the bits of said external predetermined control data are transferred to said scan-in register.

2. A data processing unit as set forth in claim 1, wherein said scan-in register and said scan-in interface are formed as a single-clip LSI circuit together with both said facility circuit division means and said control circuit division means.

3. A data processing unit in accordance with claim 1, further comprising a timing means operatively connected to said scan-in gate circuit means, for providing a scan-in control signal to said scan-in gate circuit means, said scan-in control signal operating said scan-in gate circuit means to operatively control the commencing and cessation of the operation of said scan-in register means.

4. A data processing unit as set forth in claim 3, wherein said timing means is formed as a single-chip LSI circuit together with both said facility circuit division means and said control circuit division means.

5. A data processing unit as set forth in claim 3, further comprising means for inputting to said timing means a start signal, and means for inputting to said facility and control circuit division means a main clock pulse signal, wherein said timing means starts operating when said start signal is applied thereto, the pulse width of said start signal being the same as the period of said main clock pulse signal, said main clock pulse signal enabling said facility circuit division means and said control circuit division means to perform their respective operations, and wherein said scan-out control signals are synchronous with a sub-clock pulse signal, the duration of said sub-clock pulse signal being much less than the duration of said main clock pulse signal.

6. A data processing unit as set forth in claim 5, wherein said timing means comprises a counter, a register, and a comparator, said counter, register and comparator operatively connected together, and wherein said counter starts counting the number of sub-clock pulses when said start signal is applied thereto, said register stores the number of said sub-clock pulses, the number of stored pulses bearing a relationship to the predetermined time at which said scan-out control signal is to be supplied by said timing means, said comparator receiving both the number stored in said counter and the number stored in said register, and said comparator determining the instant of time when said stored number in said counter coincides with said number stored in said register and thereby producing said scan-out control signal from said timing means at said instant of time.

7. A data processing unit in accordance with claim 1, further comprising a scan-out register means, operatively connected between said output means and said output control bus means for storing said control data provided by said control circuit division means.

8. A data processing unit as set forth in claim 1, wherein said scan-out register is connected to a scan-out interface comprised of a shift register, and wherein said shift register receives all the bits of said control data produced by said control circuit division means and stored in said scan-out register, abd said shift register sends out each group of bits of said control data therfrom and also shifts the remaining bits of said control data in said shift register by said groups of bits reciprocally and sequentially.

9. A data processing unit as set forth in claim 8, wherein said scan-out register and said scan-out interface are formed as a single-chip LSI circuit together with both said facility circuit division means and said control circuit division means.

10. A data processing unit in accordance with claim 1, further comprising a timing means operatively connected to said scan-in and scan-out gate circuit means, for providing respectively scan-in and scan-out gate circuit means, wherein said scan-in and scan-out control signals operatively control respectively the commencement and cessation of the operation of said scan-in and scan-out register means.

11. A data processing unit in accordance with claim 10, further comprising a start signal means, operatively connected to said timing means, and a clock pulse signal means, operatively connected to said facility and control circuit division means, wherein said start signal means provides a start signal for operatively commencing the operation of said timing means and said main clock pulse signal means providing a main clock pulse signal for operatively commencing the operation of said facility and control circuit division means, the pulse width of said start signal equal to the period of said mean clock pulse signal; and further providing a subclock pulse generator means operatively connected to said main clock pulse signal means and start signal means for providing a subclock pulse signal having a duration much less than the duration of said main clock pulse signal, and wherein said scan-in control signals are synchronous with said subclock pulse signal.

12. A data processing unit in accordance with claim 11, wherein said timing means comprises a counter means, a register means, and a comparator means operatively connected together whereby said counter means commences to count the number of subclock pulses when said start signal is applied to said timing means and said register means stores the number of subclock pulses, the number of stored subclock pulses bearing a relationship to the predetermined time at which said scan-in control signal is to be supplied by said timing means, said comparator means comparing the number of stored subclock pulses in said register means with the number stored in said counter means, whereby said comparator means operatively produces said scan-in control signal means when said stored number in said counter means is equal to said number stored in said register means.

13. A data processing unit as set forth in claim 10, wherein said timing means is formed as a single-chip LSI circuit together with both said facility circuit division means and said control circuit division means.

14. A data processing unit as set forth in claim 10, further comprising means for inputting to said timing means a start signal, and means for inputting to said facility and control circuit division means a main clock pulse signal, wherein said timing means starts operating when said start signal is applied thereto, the pulse width of said start signal being the same as the period of said main clock pulse signal, said main clock pulse signal enabling said facility circuit division means and said control circuit division means to perform their respective operations, and wherein said scan-out control signals are synchronous with a sub-clock pulse signal, the duration of said sub-clock pulse signal being much less than the duration of said main clock pulse signal.

15. A data processing unit as set forth in claim 14, wherein said timing means comprises a counter, a register and a comparator, said counter, register and comparator operatively connected together, and wherein said counter starts counting the number of sub-clock pulses when said start signal is applied thereto, said register stores the number of said subclock pulses, the number of stored pulses bearing a relationship to the predetermined time at which said scan-out control signal is to be supplied by said timing means, said comparator receiving both the number stored in said counter and the number stored in said register, and said comparator determining the instant of time when said stored number in said counter coincides with said number stored in said register and thereby producing said scan-out control signal from said timing means at said instant of time.

16. A method of testing a data processing unit comprising:
 a means for providing given instructions;
 a facility circuit division means for performing arithmetic and logical operations for given operand data in accordance with prescribed control data;
 a control circuit division means, operatively connected to said facility circuit division means and said means for providing given instructions, for decoding said given instructions and providing said control data to said facility circuit division means in accordance with said decoded given instructions;
 a first control bus means and a second control bus means operatively connected between said facility circuit division means and said control circuit division means for providing a data path therebetween;
 input and output means, operatively connected to said first and second control bus means respectively by output and input control bus means, for enabling the transfer of data to and from said data processing unit;
 a scan-in register means, operatively connected between said input means and said facility circuit division means by said input control bus means and said first control bus means, for storing external predetermined control data and for supplying said external predetermined control data to said facility circuit division means;
 a scan-in gate circuit means, operatively connected between said scan-in register means and said input control bus means, for controlling the flow of data from said scan-in register means to said input control bus means;
 a scan-out gate circuit means, operatively connected between said control circuit division means and said second control bus means, for controlling the flow of data from said control circuit division means to said second control bus means;
 wherein said scan-in and scan-out gate circuit means are operated selectively to alternatively allow said external predetermined control data stored in said scan-in register or said control data produced by said control circuit division means to be transfered to said facility circuit division means; and
 further comprising a scan-out register means, operatively connected between said output means and said output control bus means for storing said control data provided by said control circuit division means;

comprising steps of:
 (1) operating said scan-in and scan-out gate circuit means to prevent the flow of data through said scan-in and scan-out gate circuit means, and loading predetermined external control data to said scan-in register means;
 (2) operatively controlling said scan-in gate circuit means to enable the flow of data therethrough, whereby the predetermined external control data loaded in said scan-in register means flows to said facility circuit division means;
 (3) operatively controlling the facility circuit division means in accordance with said predetermined external control data and subsequently comparing the result of the operation of said facility circuit division means with an expected result whereby the operation of said facility circuit division means may be tested;
 (4) applying a set of given instructions to said control circuit division means;
 (5) operatively controlling said scan-in and scan-out gate circuit means so as to enable the flow of data through said scan-out means and disable the flow of data through said scan-in means, and operatively controlling said control circuit division means in accordance with said given instructions applied thereto, whereby said control data provided by said control circuit division means is loaded into said scan-out register means;
 (6) comparing said control data stored in said scan-out register with an expected data word, whereby the control circuit division means may be tested.

* * * * *